US010901059B1

United States Patent
Hu et al.

(10) Patent No.: US 10,901,059 B1
(45) Date of Patent: Jan. 26, 2021

(54) MULTI-SHOT DIFFUSION-WEIGHTED MRI RECONSTRUCTION USING UNROLLED NETWORK WITH U-NET AS PRIORS

(71) Applicant: The Board of Trustees of the Leland Stanford Junior University, Stanford, CA (US)

(72) Inventors: Yuxin Hu, Stanford, CA (US); Brian A. Hargreaves, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/779,376

(22) Filed: Jan. 31, 2020

(51) Int. Cl.
*G01R 33/56* (2006.01)
*G01R 33/48* (2006.01)
*G01R 33/563* (2006.01)

(52) U.S. Cl.
CPC ..... *G01R 33/5608* (2013.01); *G01R 33/4818* (2013.01); *G01R 33/56341* (2013.01)

(58) Field of Classification Search
CPC .......... G01R 33/5608; G01R 33/56341; G01R 33/4818
See application file for complete search history.

(56) References Cited

PUBLICATIONS

Hu, Yuxin et al. "Reconstruction of multi-shot diffusion-weighted MRI using unrolled network with U-nets as prior", Proc. Intl. Mag. Reson. Med. 27 (2019). (Year: 2019).*
Reconstruction of multi-shot diffusion-weighted MRI using unrolled network with U-nets as priors. Proc. Intl. Soc. Mag. Reson. Med. 27 (2019).
Motion-robust reconstruction of multishot diffusion—weighted images without phase estimation through locally low-rank regularization. Magn Reson Med. Feb. 2019;81(2):1181-1190.
Hu, Yuxin, et al. "Multi-shot diffusion-weighted MRI reconstruction with magnitude-based spatial-angular locally low-rank regularization (SPA-LLR)." Oct. 8, 2019. Magn Reson Med. 83(5):1596-1607.

* cited by examiner

*Primary Examiner* — G. M. A Hyder
(74) *Attorney, Agent, or Firm* — Lumen Patent Firm

(57) ABSTRACT

A method of magnetic resonance imaging performs a scan by a magnetic resonance imaging system to acquire k-space data; applies the k-space data as input to an unrolled convolutional neural network comprising multiple iterations, and generates reconstructed images from the output of the unrolled convolutional neural network by combining images from different shots. Each iteration of the unrolled network performs a first gradient update, applies the result to a first U-net in k-space, performs a second gradient update, and applies a second U-net in image space. The first gradient update and the second gradient update are based on a theoretical gradient from a physical measurement model.

5 Claims, 10 Drawing Sheets

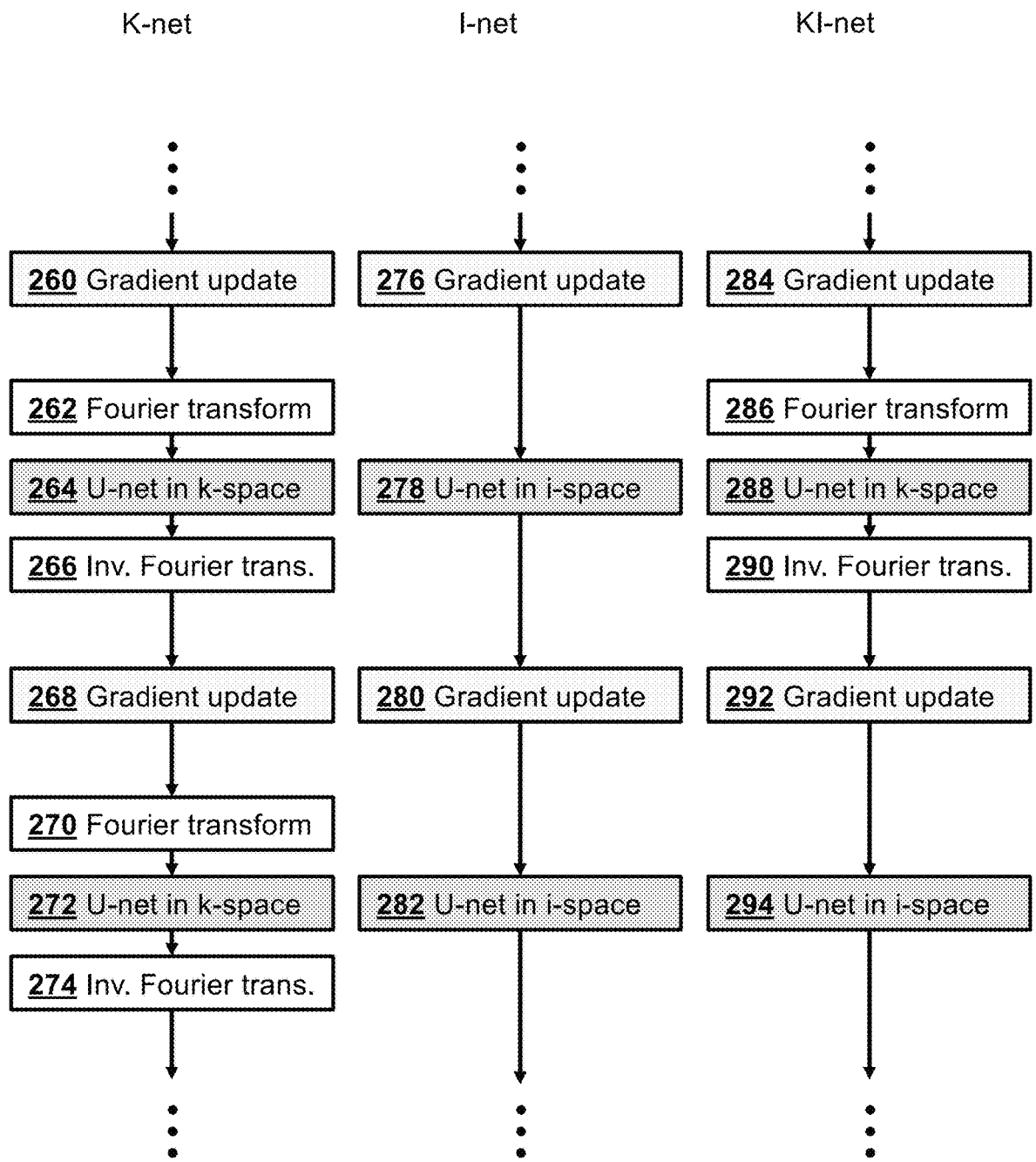

MULTI-SHOT DIFFUSION-WEIGHTED MRI RECONSTRUCTION USING UNROLLED NETWORK WITH U-NET AS PRIORS

STATEMENT REGARDING FEDERALLY SPONSORED RESEARCH OR DEVELOPMENT

This invention was made with Government support under contracts EB009055 and EB015891 awarded by the National Institutes of Health. The Government has certain rights in the invention.

FIELD OF THE INVENTION

The present invention relates generally to magnetic resonance imaging (MRI). More specifically, it relates to methods for MRI reconstruction using neural networks.

BACKGROUND OF THE INVENTION

Diffusion-weighted MRI (DWI) is widely used in many clinical applications, such as stroke prediction and tumor detection. In neuroscience applications and myocardial microstructure imaging, diffusion-weighted data along multiple diffusion-encoding directions are acquired for fitting the diffusion tensor model (DTI) or more advanced imaging models. One of the advanced DWI acquisition techniques is multi-shot echo-planar imaging (EPI), which acquires data as multiple segments. Multi-shot DWI provides images with higher resolution and signal-to-noise ratio (SNR) with reduced off-resonance-induced artifacts compared with single-shot imaging. In DWI, strong magnetic gradients are applied before data acquisition to encode diffusivity of water molecules. However, the use of diffusion-encoding gradients also makes DWI sensitive to bulk motion, leading to unpredictable phase in the image domain. These phase variations between different segments result in severe ghosting artifacts and must be corrected to successfully perform multi-shot DWI.

To solve the shot-to-shot phase variation problem, numerous methods have been proposed. However, algorithms achieving superior performance are often iterative and therefore, very slow. For example, projection onto convex sets reconstruction of multiplexed sensitivity encoded MRI (POCS-MUSE) and POCS-enhanced inherent correction of motion-induced phase errors (POCS-ICE) alternatively estimate the motion-induced phase and the image, which usually requires hundreds of iterations. Multi-shot sensitivity-encoded diffusion data recovery algorithm using structured low-rank matrix completion (MUSSELS) and multi-shot with locally low-rank regularization (shot-LLR) skip the challenging phase estimation step by using some advanced constraints in k-space and image-space, respectively. These two approaches also solve the problem iteratively and are more computationally intensive. For example, it could take one to two minutes to reconstruct one single slice. In addition, there have been efforts to jointly reconstruct DWI data along different diffusion-encoding directions. While they can achieve significant improvements in the denoising performance compared to conventional direction-independent reconstruction methods, those joint reconstruction methods could take even longer time and require much more memory. This lengthy reconstruction time limits the use of these iterative reconstruction methods in many clinical and research applications.

Convolutional neural networks (CNNs) have been recently used for MR image reconstruction. Automated transform by manifold approximation (AUTOMAP) uses raw k-space data as inputs to a deep neural network and outputs the reconstructed images. After the reconstruction network is trained, the reconstruction becomes a non-iterative reconstruction problem with simple operations (e.g., linear weighted summation) that can be highly parallelized on graphics processing units (GPUs). A primary consideration in applying CNN-based reconstruction in MRI is to reconstruct the image without generating hallucinations. Another common strategy is to combine neural networks with physical MRI models. This strategy enables a robust reconstruction by utilizing MRI models to promote data consistency and convergence. Variational networks and CNNs have been used in these architectures and have achieved reconstruction with improved image quality and speed in knee imaging, abdominal imaging, and cardiac imaging. In multi-shot DWI reconstruction, the problem can be even more challenging, as the artifacts are primarily moderate to severe ghosting due to phase variations instead of noise-like artifacts.

BRIEF SUMMARY OF THE INVENTION

This description presents a method to accelerate multi-shot DWI reconstruction using CNNs. Specifically, an unrolled network with U-nets as deep priors is adopted.

Embodiments of the present invention use an unrolled neural network containing recurrences of model-based gradient updates and neural networks for accelerating multi-shot DWI reconstruction. The unrolled network has U-net as deep priors. The technique uses neural networks operating in the spatial frequency domain where the raw k-space data are acquired. Instead of using the locally low-rank regularization, these neural networks use U-nets alternating in k-space and image space (which we call a KI-net). Physical MRI models are used between these networks to maintain high data consistency. We use the trainable neural networks as the presumed constraints, which are trained and tested with high-fidelity brain images. The network may be trained on results from a high-SNR joint reconstruction of multi-direction data and applied to single-direction data.

In-vivo experiments demonstrate that these trainable neural networks can serve as the presumed constraints and significantly reduce the number of iterations. In addition, by training the neural network with the joint reconstruction as the ground truth, the KI-net reconstruction shows improved denoising performance when comparing with conventional shot-LLR reconstruction, both with single-direction data as inputs. Fine-tuning the network trained from brain data with two breast subjects also shows good generality to other breast cases.

This KI-network combining physical-model update and neural network update has various applications including:

1) Reconstruction of multi-shot DWI of different body parts, like brain, breast, and liver, to achieve real-time reconstruction while maintaining high image quality.

2) Shot-to-shot inconsistency correction in multi-shot EPI.

3) Other kinds of reconstruction, to replace the conventional regularization terms, like L2-norm, L1-norm, L1-wavelet.

4) The results of KI-net suggest that alternating the neural network space between the data-acquired space and image space could improve the results. This idea could also be used for other kinds of MRI reconstruction, or other image modalities.

5) Using a joint reconstruction as ground truth help this method to achieve better results than conventional methods. This idea could be used for other deep learning tasks to overcome the limitation of lack of ground truth.

6) The idea of adding skip connections in U-net could help improve results of other applications involving U-nets.

Comparing pure deep-learning-based methods, the present method includes updates based on the physical model, and it helps reduce 1) the occurrence of hallucinations, 2) the size of neural network needed for this application, and 3) the required training data.

Comparing conventional methods based on presumed constraints, the present method 1) is much faster with a significantly reduced number of iterations, and 2) gives better results, by using neural network update which has high flexibility in capturing and memorizing the real property of images being reconstructed.

Including the U-net in k-space and alternating the U-net between k-space and image space achieves results with the smallest difference.

Using a joint reconstruction as ground truth helps this method to achieve better results than conventional methods, not only a faster speed. Adding skip connections in the U-net helps with the convergence.

In one aspect, the invention provides a method of magnetic resonance imaging comprising: performing a scan by a magnetic resonance imaging system to acquire k-space data; applying the k-space data as input to an unrolled convolutional neural network comprising multiple iterations, and generating reconstructed images from the output of the unrolled convolutional neural network by combining images from different shots. Each iteration comprises: performing a first gradient update, applying a first U-net in k-space, performing a second gradient update, and applying a second U-net in image space. The first gradient update and the second gradient update are based on a theoretical gradient from a physical measurement model.

Preferably, the physical measurement model comprises a receiving coil sensitivity map and a data sampling pattern. Preferably, the scan is a multi-shot diffusion weighted scan. Preferably, the first U-net and second U-net include skip connections. Preferably, the first U-net and second U-net include res-nets.

BRIEF DESCRIPTION OF THE SEVERAL VIEWS OF THE DRAWINGS

FIG. 2C, 2D, 2E are schematic diagrams illustrating three different network architectures of a K-net, I-net, and KI-net according to embodiments of the invention.

DETAILED DESCRIPTION OF THE INVENTION

Figure 1:
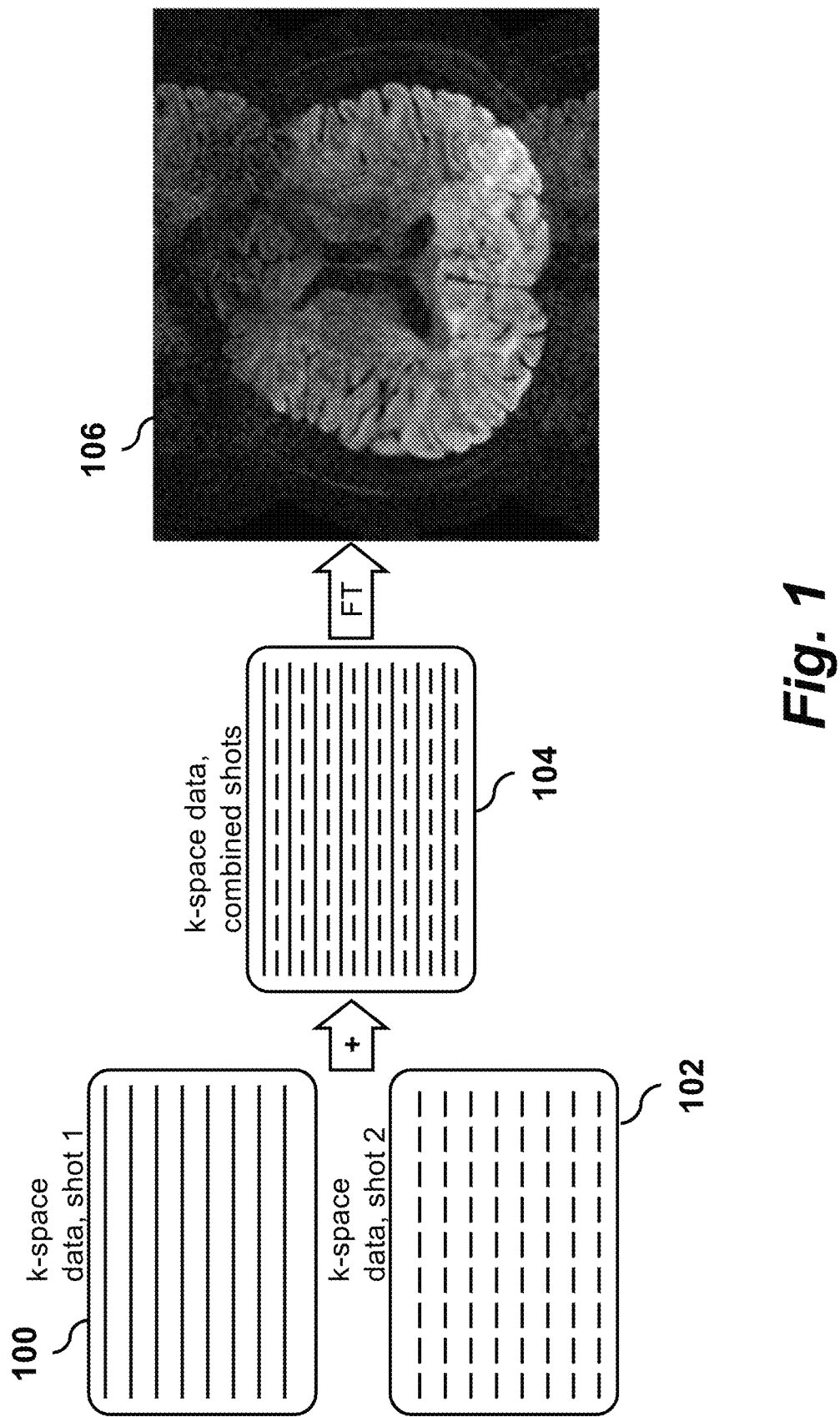
FIG. 1 is a schematic illustration of the sampling pattern of multi-shot (interleaved) DWI and motion-induced ghosting artifacts resulting from simply combining data from different shots.

In interleaved multi-shot DWI, k-space data is acquired in multiple interleaved segments or shots 100, 102, as shown in FIG. 1. Directly combining those segments by interleaving to produce combined shots 104 leads to motion-induced ghosting artifacts in the image domain 106 since each segment is modulated by a different phase due to motion.

In conventional shot-LLR reconstruction, published as Magn Reson Med. 81(2):1181-1190, a relaxed model is used to avoid the phase estimation step, and a locally low-rank (LLR) constraint is used to utilize the correlations between those images from different shots, as follows, $$\min_{x_1, \ldots, x_N} \Sigma_{i=1, \ldots, N} \|A_i x_i - y_i\|^2 + LLR(x_1, \ldots, x_N)$$

where $x_1, \ldots, x_N$ are the images of N different shots to be reconstructed, $A_i$ is the encoding operator for the i-th shot, which is a combination of sampling operator, Fourier transform and sensitivity encoding operator, $y_i$ is the acquired data of the i-th shot, $\|\cdot\|$ is the L2 norm, and $LLR(x_1, \ldots, x_N)$ represents the locally low-rank regularization term. A fast iterative shrinkage-thresholding algorithm (FISTA) is used to solve this optimization problem with 200 iterations, in which images are alternatively updated by the gradient of the model consistency and the proximal operator of the LLR term.

Additionally, a non-linear model with spatial-angular-LLR regularization (SPA-LLR), published as Magn Reson Med. 83(5):1596-1607, may be used for joint reconstruction of all diffusion-encoding directions. This method achieves multi-direction DWI reconstruction and shows significantly improved denoising performance compared to the original single-direction reconstruction. The results of this joint reconstruction are used as the ground truth to train our network though with single-direction data as the input.

To accelerate the image reconstruction while maintaining the advantages of the model-based methods, embodiments of the present invention replace the regularization term (LLR in this case) with a neural network. Within each iteration, the image is first updated based on the theoretical gradient from the physical model (the first term in Eq.1), and the updated image is then fed to the neural network to generate images for the next iteration.

Figure 2A:
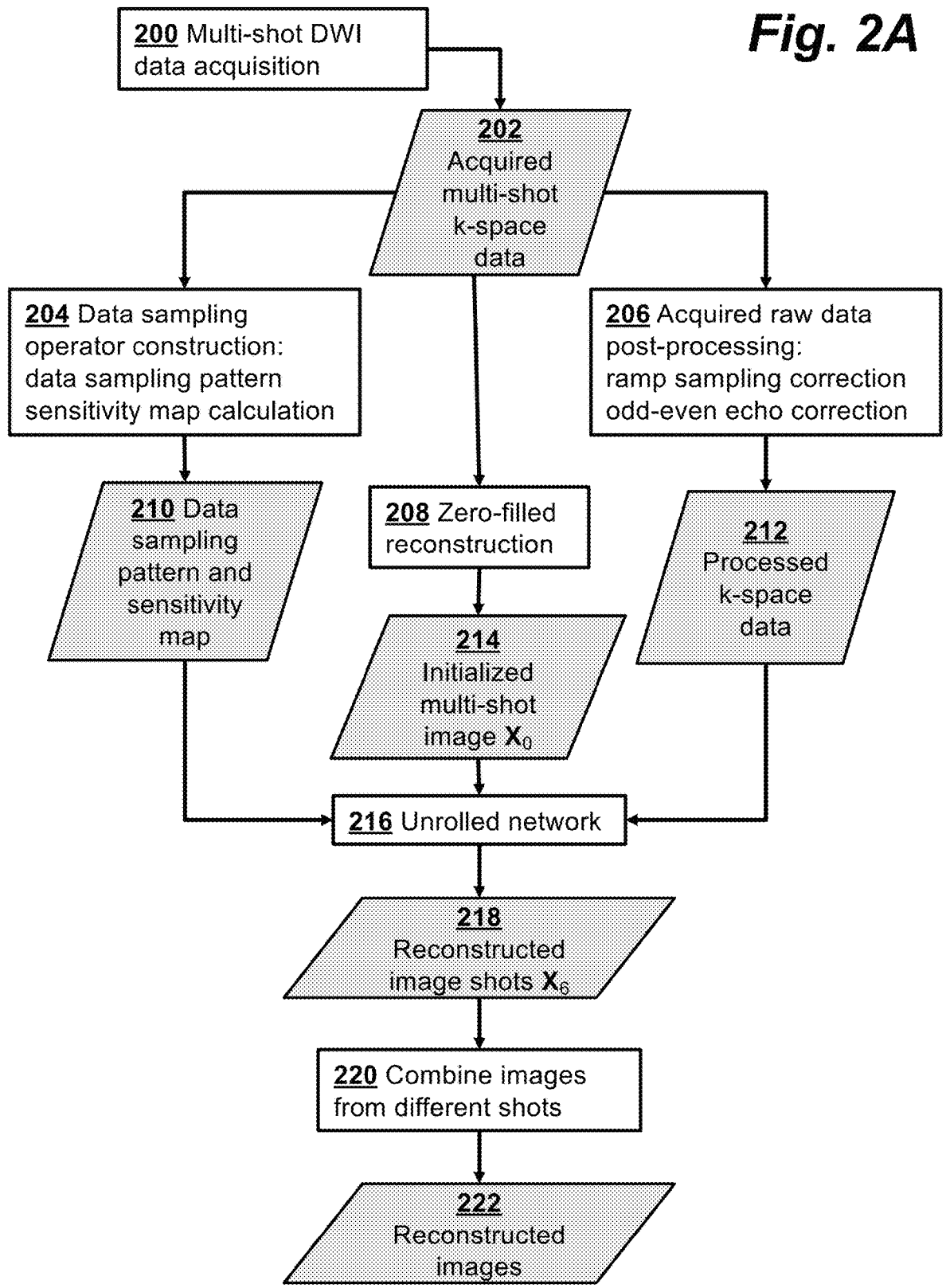
FIG. 2A is an overview of the processing pipeline for a method of MRI reconstruction according to an embodiment of the invention.

An overview of the processing pipeline for a method of MRI reconstruction according to an embodiment of the invention is shown in FIG. 2A. In step 200, an MRI scanner performs multi-shot DWI data acquisition, producing acquired multi-shot k-space data 202. The acquired multishot data 202 is provided as input to steps 204, 206, and 208. In data sampling operator construction step 204, a data sampling pattern and sensitivity maps 210 are calculated. In post-processing step 206, the multi-shot k-space data 202 undergoes conventional ramp sampling correction and odd-even echo correction, producing processed k-space data 212. Step 208 performs a zero-filled reconstruction to produce an initial multi-shot image 214 that is input into the unrolled network 216 together with the processed k-space data 212 and data sampling pattern and sensitivity maps 210. The output of unrolled network 216 is a set of reconstructed image shots 218 which are combined in step 220 using amplitude averaging or root-sum-of-square to produce a reconstructed image 222.

Figure 2B:
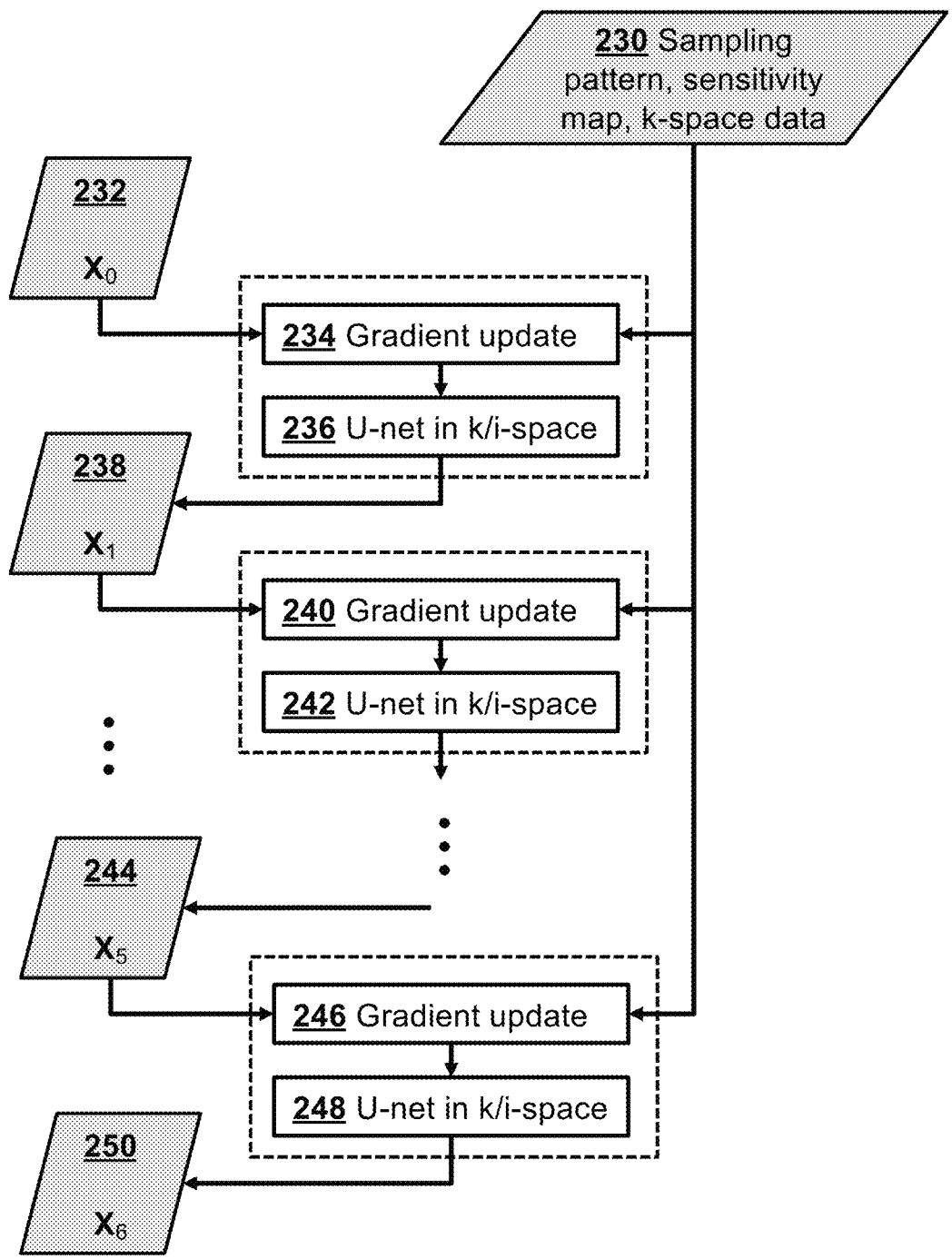
FIG. 2B is a processing pipeline using an unrolled network with deep priors, in which conventional LLR regularization is replaced by a neural network according to an embodiment of the invention.

The details of unrolled network 216 with deep priors are now described in more detail in relation to FIG. 2B. The unrolled network solves the inverse problem in imaging with a much smaller number of iterations than the conventional method. As a result of the reduced number of iterations and straightforward convolutional operations in the neural network, the reconstruction time is significantly decreased. The initialized (zero-filled) multi-shot image $X_0$ 232 is input to the first iteration, which includes a gradient update 234 followed by a U-net 236, to produce multi-shot image $X_1$ 238. Similarly, multi-shot image $X_1$ 238 is input to the second iteration, which includes a gradient update 240 followed by a U-net 242, to produce multi-shot image $X_2$, and so on. In the last iteration, multi-shot image $X_5$ 244 is input to gradient update 246 followed by a U-net 248, to produce multi-shot image $X_6$ 250. The gradient updates 234, 240, 246 are performed using data 230, and the gradient of the data consistency term (i.e., the first term in the shot-LLR equation) is calculated using sampling pattern, sensitivity maps, and processed k-space data. In general, there may be N iterations in total, where N is a hyper-parameter to be tuned. The example shown uses N=6.

One iteration of the network includes a combination of a gradient update and a U-net update. The gradient update blocks are used between these U-nets as data consistency terms. Therefore, the output of the previous network is updated based on the data consistency term, before it was given to the following network.

Either k-space or image-space data may be used as the input of the network in each iteration. Three network structures illustrating different alternative embodiments are shown in FIG. 2C, FIG. 2D, and FIG. 2E.

The network of FIG. 2C uses k-space data as the input to U-net in every iteration (i.e., K-net), and therefore Fourier transform and inverse Fourier transform are used before and after each U-net, respectively. The figure shows two iterations of such a network, an iteration with a gradient update 260 followed by a Fourier transform 262, U-net 264 in k-space, and inverse Fourier transform 266, and another similar iteration with a gradient update 268 followed by a Fourier transform 270, U-net 272 in k-space, and inverse Fourier transform 274.

The network of FIG. 2D uses image-space data as the input to U-net in every iteration (i.e., I-net), and therefore no Fourier transforms or inverse Fourier transforms are used. The figure shows two iterations of such a network, an iteration with a gradient update 276 followed by a U-net 278 in k-space, and another similar iteration with a gradient update 280 followed by a U-net 282 in image-space.

The network of FIG. 2E is a hybrid design that alternatively uses k-space data and image-space data as the input to the U-net in alternate iterations (i.e., KI-net), and therefore Fourier transforms and inverse Fourier transforms are used in alternate iterations as well. The figure shows two iterations of such a network, a k-space iteration with a gradient update 284 followed by a Fourier transform 286, U-net 288 in k-space, and inverse Fourier transform 290, and an image-space iteration with a gradient update 292 followed by a U-net 294 in image-space.

Figure 3A:
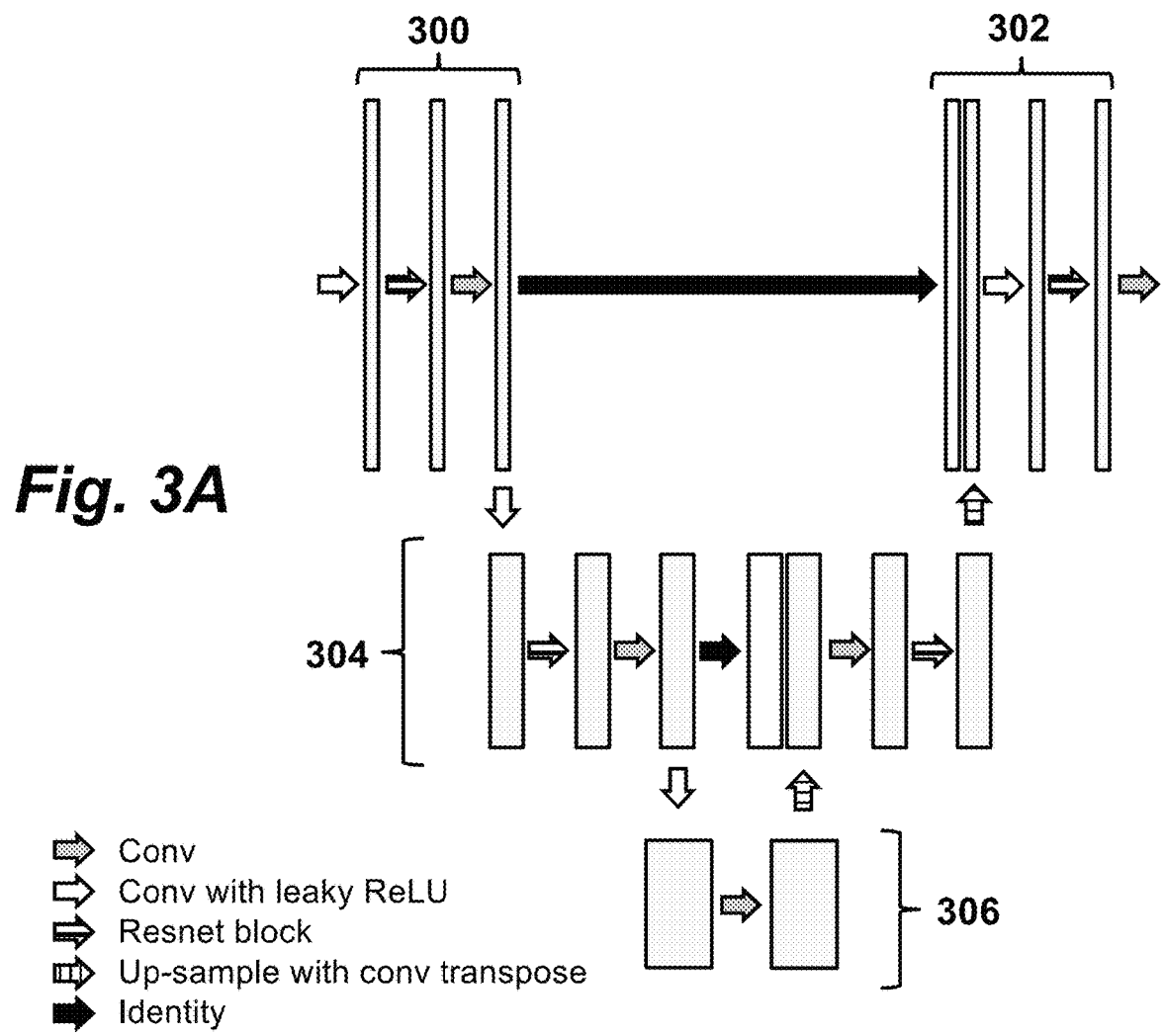
FIG. 3A and FIG. 3B are schematic diagrams illustrating details of a U-net used in embodiments of the present invention.

In each iteration, a U-net is used to update the image instead of conventional LLR update. The U-net structure used in one embodiment of the KI-net is detailed in FIG. 3A and FIG. 3B, which has 43 layers and a total number of 438,961 parameters. In a U-net, the results from upstream convolution layers go through different depths of downstream convolution layers, and the outputs from layers in different levels are up-sampled and concatenated to produce the final output. With this structure, layers at different levels tend to capture features at different scales, i.e., convolution layers at higher levels focus more on local structures, while layers at the bottom have a bigger field of view. As shown in FIG. 3A, the image-space or k-space input to the U-net first passes through an initial set of three layers 300 that includes a convolution with leaky ReLU, resnet block, and convolution. The result is fed forward as input to a final set of layers 302 as well as provided as input via a convolution with leaky ReLU to a lower level of layers 304 that includes a resnet block, convolution, feed forward, convolution and resnet block, which is up-sampled with convolution transpose to the input of the set of layers 302. The output of the resnet block and convolution of level 304 is input via a convolution and leaky ReLU to lower level of layers 306 that includes a convolution followed by up-sampling with convolution transpose before being input to the convolution and resnet block at the end of level 304.

Figure 3B:
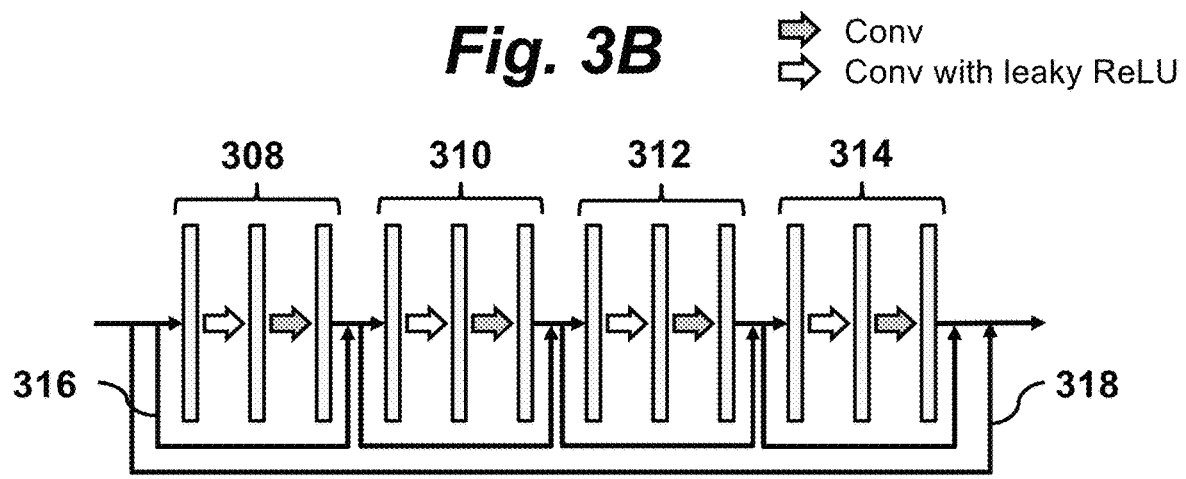

Each resnet block of FIG. 3A may be implemented using the structure shown in FIG. 3B, where there is a sequence of four sequential sets 308, 310, 312, 314 of three layers each. Each of the sets has a convolution with leaky ReLU followed by a convolution, as well as a feed-forward 316 from its input to its output. In addition, there is a feed-forward 318 from the input of the four sets to the output.

In operation, multi-shot DWI k-space data may be acquired on a suitable MRI scanner, such as a 3 T MR750 scanner (GE Healthcare, Waukesha, Wis.) using a 32-channel head receive-only coil, a 16-channel breast coil, and a 3 T GE Signa Premier scanner using a 48-channel head receive-only coil. The scanning acquisition may use, for example, a 2D single-refocused Stejskal-Tanner diffusion-weighted spin-echo EPI sequence.

In an illustrative example, eleven brain scans were performed on seven volunteers with the following parameters: TR/TE=2000-5600 ms/50-56 ms, b-value=1000 s/mm$^2$, number of shots=4, number of slices=12 to 30, slice thickness=3 or 4 mm, number of diffusion-encoding directions=30 or 45 or 60 (for ten DTI scans), in-plane resolution=0.8-0.9 mm, and field-of-view=20-22 cm. Among these brain scans, eight DTI experiments from four volunteers (two experiments for each volunteer) containing 10260 images were used for training. Two DTI experiments on the fifth and sixth volunteers, each with 360 images, were used as the validation data for choosing hyper-parameters and test data, respectively. One additional brain DWI scan with six repetitions and other acquisition parameters unchanged was performed on a seventh volunteer to further validate the KI-net reconstruction method.

Axial breast DWIs from eight subjects were used to test the generalization of the KI-net reconstruction with the following parameters: TR/TE=6000-6600 ms/60-65 ms, b-value=600 s/mm$^2$, number of shots=4, slice thickness=5 mm, in-plane resolution=1 mm, and field-of-view=36 cm. For each case, the central 12 slices with good breast coverage were used. Two cases were used to fine-tune the network trained from the brain data, and the left six cases were used for testing.

The acquired data were first processed by the product algorithm for Nyquist artifact correction and ramp sampling correction. All corrected data were then normalized and coil compressed to eight channels using geometric coil compression. All brain data were zero-filled to 256×256 pixels, and all breast data were zero-filled to 360×360 pixels. Sensitivity maps were calculated based on combined b=0 images using ESPIRiT (for encoding operator construction A in Eq. 1).

Images reconstructed using embodiments of the invention were compared with those using shot-LLR (based on BART) and SPA-LLR in Matlab. These two algorithms were run on a Linux workstation with a 2.3 GHz CPU and a 256 GB RAM. For shot-LLR, we used 200 iterations and a regularization parameter of 0.008. For SPA-LLR, we used 100 iterations, a regularization parameter of 0.05. The reconstruction results of joint reconstruction (SPA-LLR) were used as ground truth in training.

The deep-learning reconstruction method may be implemented in Python with a TensorFlow backend. To deal with complex data, it may be separated into two channels containing the real and imaginary components, respectively, as the input to the U-net. We used an averaged L1-norm difference as the loss function, Xavier as initialization, and Adam as the adaptive learning method with a learning rate of 0.0004. We trained the unrolled network with six gradient updates and six different U-nets in each iteration on a Nvidia TITAN Xp GPU for 30 hours. For the fine-tuning of the network with two breast cases, a learning rate of 0.00004 was used, shot-LLR reconstruction was used as target, and it took about three hours on the same GPU.

To choose the hyper-parameters and evaluate the performance of the KI-net reconstruction, we compared the images reconstructed by different methods in terms of peak-signal-to-noise ratio (PSNR), root-mean-square error normalized by the norm of the reference (NRMSE), and structural-similarity metric (SSIM). To evaluate the denoising performance of the KI-net reconstruction, we compared the results of the KI-net on one repetition data with the averaged shot-LLR results on six-repetition data and also evaluated the images with the metrics above. The feasibility of the KI-net reconstruction was also tested on a DTI model using results of different directions, compared with shot-LLR and joint reconstruction. To test and evaluate the generalization of the KI-net reconstruction on other imaging targets, we fine-tuned the network trained on the brain data and applied the tuned network to the breast data acquired from a different scanner and coil.

For DTI fitting, all diffusion-weighted images were corrected for eddy current distortion and bulk motion, and co-registered using the "eddy" function from the FMRIB Software Library (FSL). The DTI model was fitted using FSL's "dtifit" function to derive the fractional anisotropy (FA) and the primary eigenvector (V1).

Figure 4:
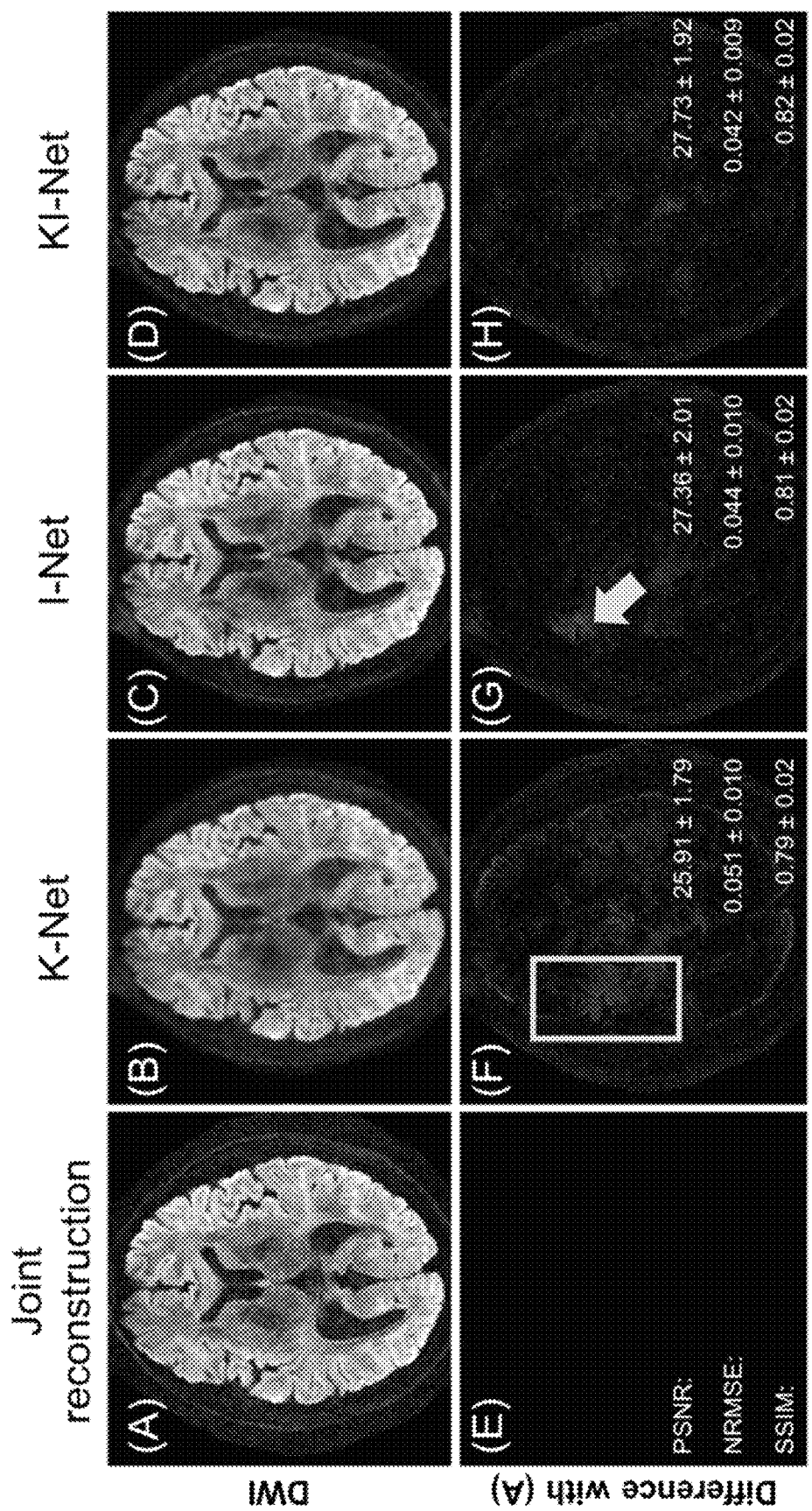
FIG. 4 is a collection of images illustrating reconstruction results from K-net, I-net, and KI-net, together with corresponding maps of their differences with joint reconstruction results, according to embodiments of the invention.

FIG. 4 shows in the top row the DWI reconstruction results from the ground truth joint reconstruction, K-net, I-net, and KI-net. The second row shows the corresponding difference maps compared with the ground truth. Note that six iterations were used for all three networks. Regarding the network architecture, the same number of layers and sizes (43 layers with 438,961 parameters in each U-net) of U-nets were chosen for the K-net, I-net, and KI-net in each of the different domains, resulting in the same number of parameters. The image reconstructed using U-nets in only k-space presents some structural differences while that using U-nets in only image space shows some residual ghosting artifacts when comparing to the ground truth. Compared to the results of the K-net and I-net, the difference between the KI-net output and the ground truth is the smallest. FIG. 4 also shows the mean and standard deviation of PSNR, NRMSE, and SSIM across all validation images. Alternating the domains of the U-net gives the lowest NRMSE, highest PSNR, and highest SSIM among those three architectures. Thus, we focus on the KI-net in all the remaining results.

Figure 5:
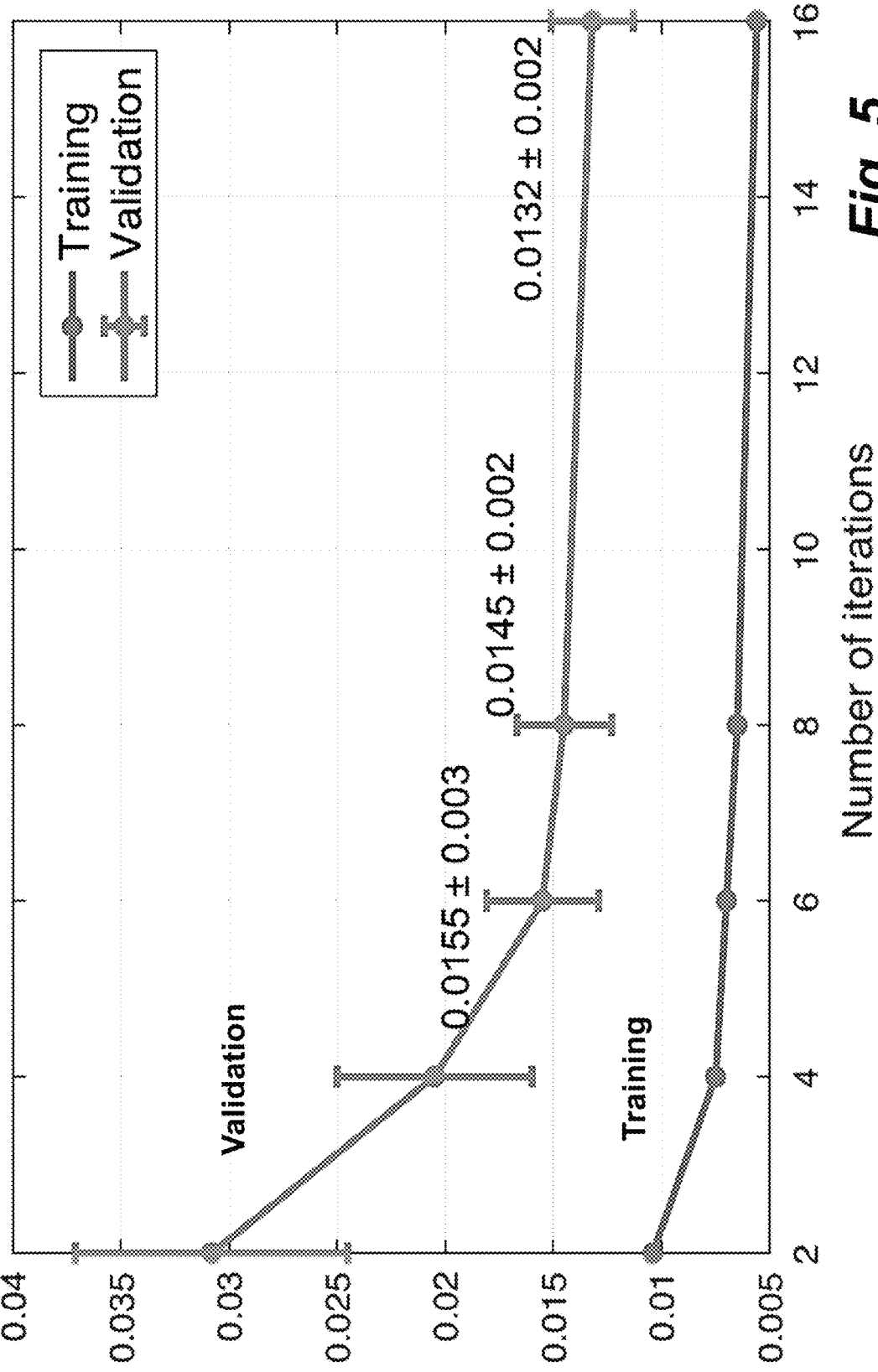
FIG. 5 is a graph of both averaged L1-loss for training and for validation versus the number of iterations, according to embodiments of the invention.

FIG. 5 graphs the final training loss and validation loss versus different numbers of iterations. Both the training loss and the validation loss decrease with an increasing number of iterations. At the same time, the improvements on L1-Loss from six iterations to sixteen iterations is very small. Considering the linearly growing cost of reconstruction time and computational resources with the number of iterations, use of six iterations provides a good balance between performance and computational cost.

Figure 6:
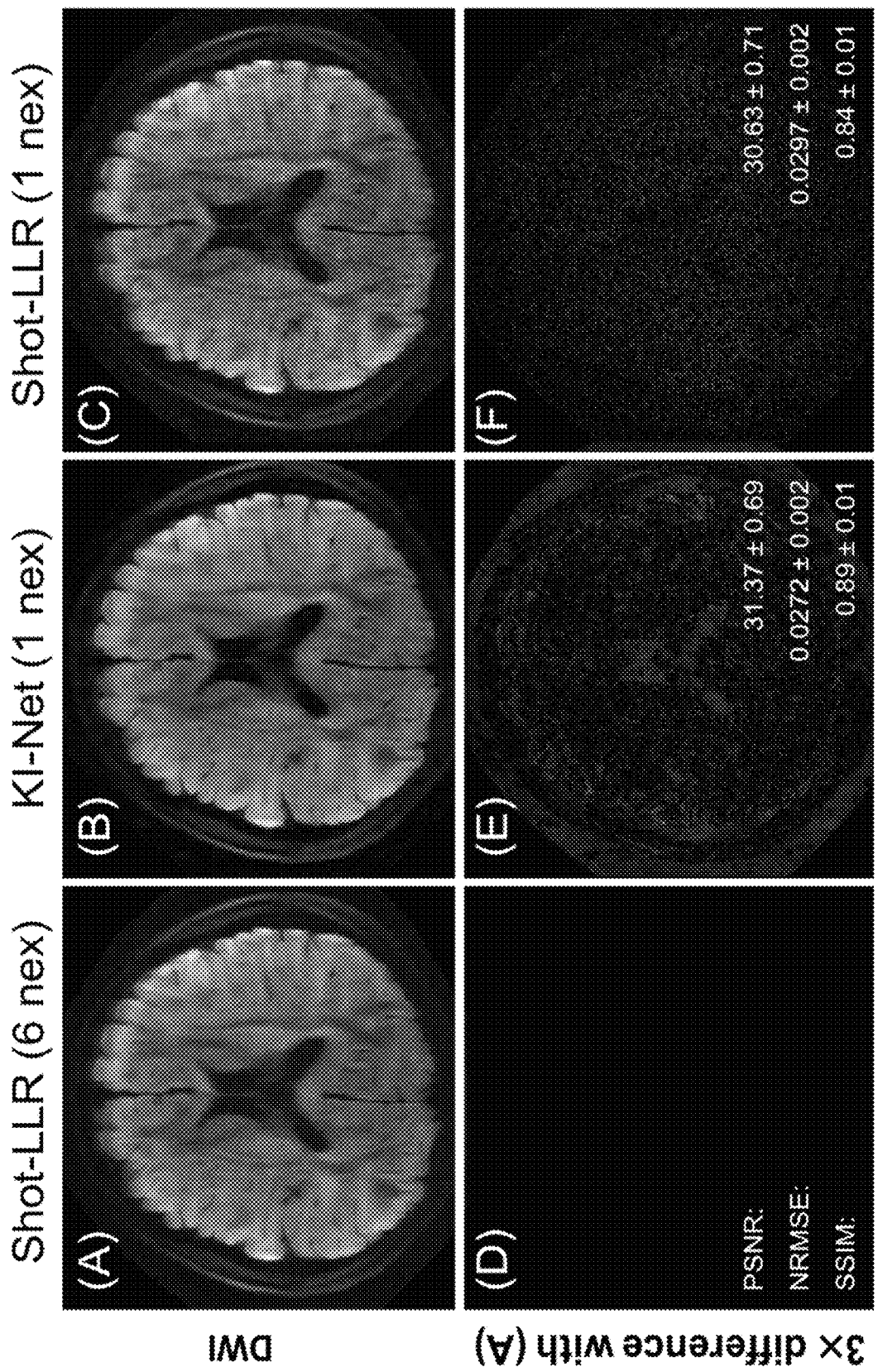
FIG. 6 is a collection of images illustrating the reconstruction results of shot-LLR, KI-net and shot-LLR, together with corresponding maps of their differences with shot LLR results according to embodiments of the invention.

FIG. 6 shows in the first row a comparison between the 6-nex averaged image reconstructed from shot-LLR and reconstructed images of one repetition using KI-net and 1-nex shot-LLR (row 1). The second row shows the corresponding three-times difference maps. The denoising effect of the averaging operation using six repetitions can be visualized with 6-nex shot-LLR and 1-nex shot-LLR. The main difference between KI-net and the 6-nex averaged image is at the air (edge) and CSF (center) region. For all regions of interest, the KI-net reconstruction shows comparable results to the averaged results of six repetitions, while only using one repetition of the acquired data. To exclude the influence of the brain mask on the data calculated, the central 160-by-160 regions were used for calculation of PSNR, NRMSE, and SSIM. For all six repetitions and all slices, KI-net shows relatively higher PSNR (31 dB) and SSIM (0.89) compared with 1-nex shot-LLR reconstruction.

Figure 7:
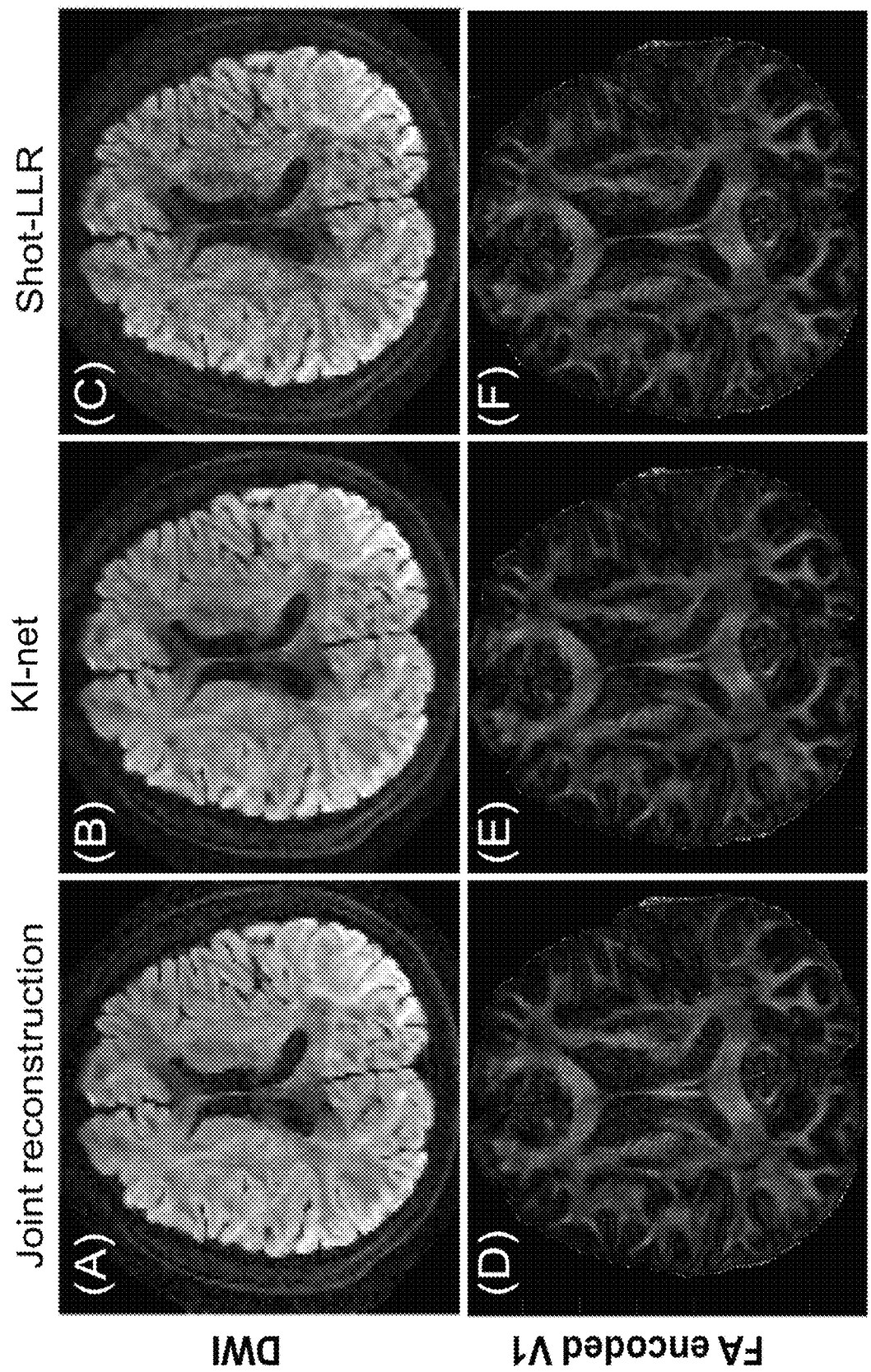
FIG. 7 is a collection of images illustrating the reconstructed DWI from joint reconstruction, KI-net, and shot-LLR (row 1), together with corresponding FA-encoded V1 maps according to embodiments of the invention.

FIG. 7 shows in the top row the reconstruction results of the test DTI data with the joint reconstruction, KI-net, and shot-LLR. The shot-LLR result is noisier than the joint reconstruction result, while KI-net shows comparable results to the joint reconstruction. The second row shows corresponding FA-encoded V1 maps, where no visible differences can be seen between the joint reconstruction and KI-net reconstruction derived from all 30 diffusion-encoding directions.

Table 1 shows the PSNR, NRMSE, and SSIM of the KI-net method and shot-LLR compared with joint reconstruction, across all 360 test images of a DTI scan. KI-net shows 2 dB higher PSNR, 20% decreased NRMSE (from 0.0344 to 0.0267), and about 0.01 higher SSIM compared with shot-LLR. At the same time, KI-net on a GPU takes about 0.1 seconds to reconstruct an image as shown in Table 2. In comparison, the iterative methods of shot-LLR and joint reconstruction take about 28 seconds and 130 seconds, respectively per slice. Overall, KI-net achieved an over 100-fold speedup in reconstruction.

TABLE 1

|  | KI-net | Shot-LLR |
| --- | --- | --- |
| PSNR | 31.67 ± 1.90 | 29.49 ± 2.00 |
| NRMSE | 0.0267 ± 0.006 | 0.0344 ± 0.0077 |
| SSIM | 0.89 ± 0.01 | 0.88 ± 0.01 |

TABLE 2

|  | KI-net | Shot-LLR | SPA-LLR |
|---|---|---|---|
| Brain | 0.09 sec | 28 sec | 130 sec |
| Breast | 0.24 sec | 40 sec | n/a |

Table 2 shows the averaged reconstruction time of different methods on brain and breast datasets after coil compression. The time of loading raw data and calculating the sensitivity map was not included. The reconstruction time of deep learning was reported by Tensorflow. The reconstruction time of SPA-LLR (joint reconstruction) was divided by the number of diffusion-encoding directions after full reconstruction.

Figure 8:
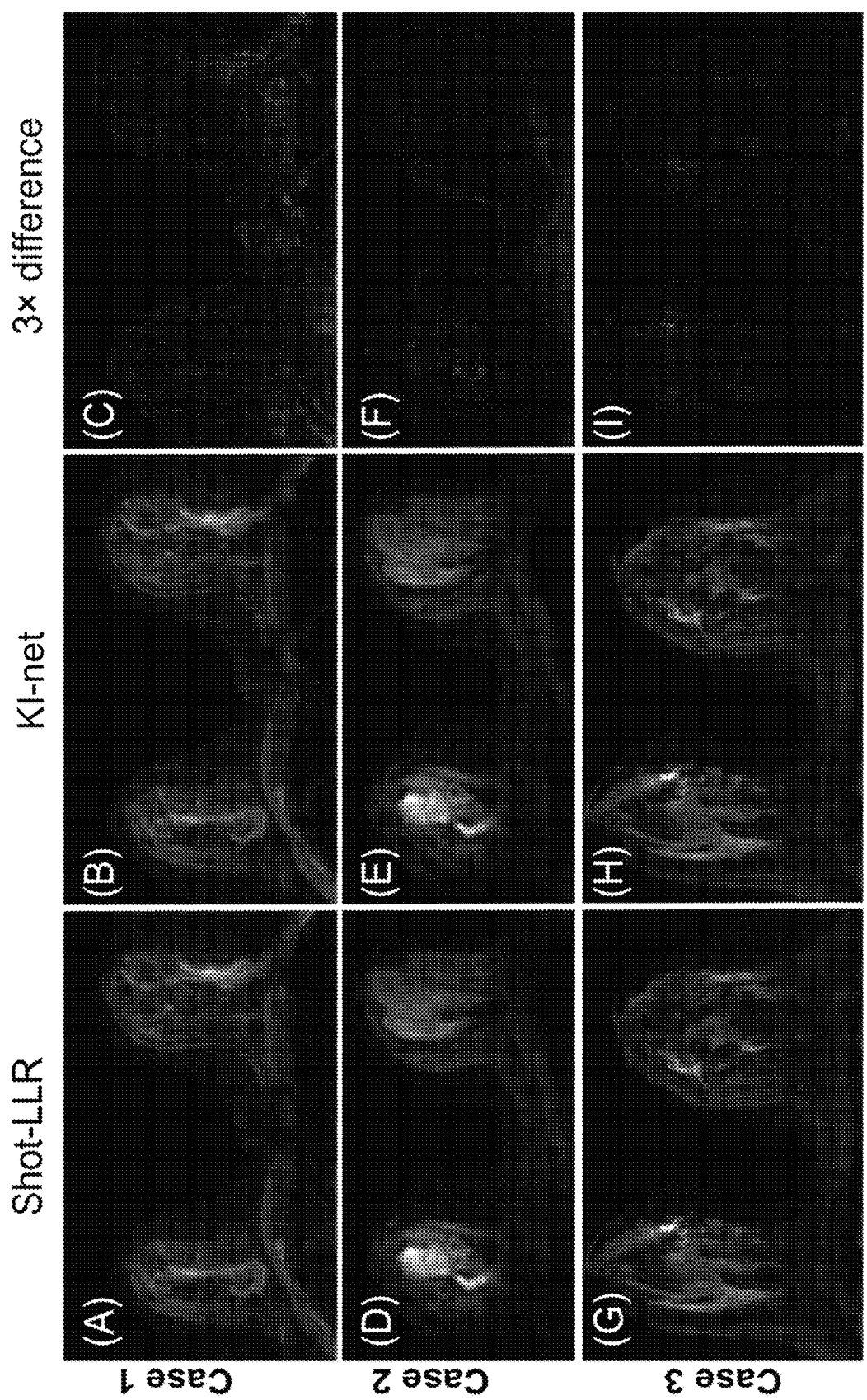
FIG. 8 is a collection of images illustrating three breast images cases reconstructed by shot-LLR, KI-net, and the three times differences between those two methods, according to embodiments of the invention.

The generalization ability of the KI-net reconstruction method is demonstrated in FIG. 8. The three rows correspond to three representative breast scans. Each row shows the images reconstructed by shot-LLR and the KI-net, together with the three-times difference between them. The KI-net achieved comparable results to the shot-LLR reconstruction as indicated by the three times differences between those two methods. KI-net achieved comparable image quality with a speed of 0.24 second per slice (Table 2). In addition, the KI-net successfully reconstructed the tumor in the left side breast of the case 2.

The present CNN-based multi-shot DWI reconstruction technique can achieve similar results to joint reconstruction (from multiple directions) with single-direction data only, and it achieves almost real-time reconstruction at less than one second per slice by using only six iterations, each having a neural network calculation and gradient updates.

The training of deep CNNs benefits from large amounts of previously acquired data and these large-scale networks have high flexibility in capturing and memorizing the property/relationships of images being reconstructed, compared with conventional methods using presumed regularization terms, such as LLR. Moreover, the networks in different iterations may be different, making the proposed reconstruction more efficient than conventional reconstruction with fixed constraints. Gradient updates based on the physical model help maintain the accuracy and robustness of the KI-net reconstruction. Gradient updates also help reduce the amount of required training data. In our case, training data from four volunteers shows good generalization to other subjects, and the total scan time to acquire training data is less than four hours, which significantly improves the feasibility of this method. The same strategy can be used for other types of applications that require online reconstruction.

By using results from a joint reconstruction as ground truth, the KI-net reconstruction has denoising capabilities similar to averaging multiple repetitions. Moreover, since the reconstruction with the KI-net was done in less one second, it may benefit actual clinical scans in comparison with conventional approaches.

To determine the optimal architecture for the deep-learning model, we trained networks in the k-space as well as in the image space. KI-net, in which the input space alternates between k-space and image space, achieves the best results among three types of input data to the U-net in each iteration. Alternating the domains of U-nets allowed us to directly fill unacquired data in the k-space domain, then refine and denoise the results in the image domain. The KI-net reconstruction shows a fairly robust reconstruction with only six iterations. This could also be attributed to the fact that the U-net in each iteration is different. Therefore, the entire network has flexibility with only six iterations. Small standard deviations of PSNR, NRMSE, and SSIM between different slices and diffusion-encoding directions also indicate good robustness of the KI-net.

The KI-net reconstruction provides promising reconstruction results and demonstrates the ability of the KI-net reconstruction to extend to various applications. This outcome suggests that the network is learning to solve the generalized phase variation problem instead of memorizing brain structures. The present techniques may be used with more complex neural network architectures and advanced loss functions.

In conclusion, this data-driven approach for multi-shot DWI reconstruction uses a deep-learning architecture combining the MRI physical model and U-nets in both k-space and image space as trainable priors. The approach enables faster reconstruction and improved results for brain DWI reconstruction compared with conventional reconstruction methods. It also shows the potential for other generalized tasks such as breast DWI reconstruction. The unrolled network reconstruction dramatically improves the reconstruction performance with a 2 dB higher peak signal-to-noise ratio (PSNR) and a 20% decreased normalized root-mean-square error (NRMSE), and achieves over 100-fold acceleration of the reconstruction speed compared to conventional locally low-rank reconstruction.

The invention claimed is:
1. A method of magnetic resonance imaging comprising:
 a) performing a scan by a magnetic resonance imaging system to acquire k-space data;
 b) applying the k-space data as input to an unrolled convolutional neural network comprising multiple iterations, wherein each iteration comprises:
  i) performing a first gradient update,
  ii) applying a first U-net in k-space,
  iii) performing a second gradient update, and
  iv) applying a second U-net in image space;
  wherein the first gradient update and the second gradient update are based on a theoretical gradient from a physical measurement model; and
 c) generating reconstructed images from the output of the unrolled convolutional neural network by combining images from different shots.
2. The method of claim 1 wherein the physical measurement model comprises a receiving coil sensitivity map and a data sampling pattern.
3. The method of claim 1 wherein the scan is a multi-shot diffusion weighted scan.
4. The method of claim 1 wherein the first U-net and second U-net include skip connections.
5. The method of claim 1 wherein the first U-net and second U-net include res-nets.

* * * * *